United States Patent
Ohuchi et al.

(10) Patent No.: US 9,660,213 B2
(45) Date of Patent: May 23, 2017

(54) ORGANIC EL ELEMENT AND MANUFACTURING METHOD THEREOF, AND METAL OXIDE FILM FORMING METHOD

(75) Inventors: Satoru Ohuchi, Osaka (JP); Shinya Fujimura, Osaka (JP); Hirofumi Fujita, Ehime (JP); Thanh Kinh Luan Dao, Osaka (JP); Takahiro Komatsu, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/112,357

(22) PCT Filed: Sep. 4, 2012

(86) PCT No.: PCT/JP2012/005579
§ 371 (c)(1),
(2), (4) Date: Oct. 17, 2013

(87) PCT Pub. No.: WO2013/128504
PCT Pub. Date: Sep. 6, 2013

(65) Prior Publication Data
US 2014/0042423 A1    Feb. 13, 2014

(30) Foreign Application Priority Data
Mar. 2, 2012  (JP) .................... 2012-046499

(51) Int. Cl.
*H01L 51/50*    (2006.01)
*H01L 51/56*    (2006.01)

(52) U.S. Cl.
CPC ...... *H01L 51/5092* (2013.01); *H01L 51/5004* (2013.01); *H01L 51/56* (2013.01)

(58) Field of Classification Search
CPC combination set(s) only.
See application file for complete search history.

(56) References Cited

U.S. PATENT DOCUMENTS

| 5,443,922 A | 8/1995 | Nishizaki et al. |
| 2006/0211272 A1 | 9/2006 | Lee et al. |

(Continued)

FOREIGN PATENT DOCUMENTS

| JP | 05-163488 | 6/1993 |
| JP | 2000-223276 | 8/2000 |

(Continued)

OTHER PUBLICATIONS

International Search Report (ISR) in International Patent Application No. PCT/JP2012/005579, dated Dec. 11, 2012.

(Continued)

*Primary Examiner* — Fernando L Toledo
*Assistant Examiner* — Lawrence-Linh T Nguyen
(74) *Attorney, Agent, or Firm* — Greenblum & Bernstein, P.L.C.

(57) ABSTRACT

An organic EL element including: an anode and a cathode disposed to face each other with a gap therebetween; a functional layer that contains an organic material and is disposed between the anode and the cathode; and an electron injection layer that has a function to inject electrons into the functional layer and is disposed between the anode and the cathode. The electron injection layer contains a metal oxide with $d^0$ electron configuration, and a Fermi level of the electron injection layer is located in a vicinity of a lower end of a conduction band of the electron injection layer.

3 Claims, 7 Drawing Sheets

(56) References Cited

U.S. PATENT DOCUMENTS

| | | |
|---|---|---|
| 2006/0292736 A1 | 12/2006 | Lee et al. |
| 2007/0169816 A1 | 7/2007 | Lee et al. |
| 2007/0221926 A1* | 9/2007 | Lee .................. B82Y 10/00 257/79 |
| 2009/0015150 A1* | 1/2009 | Kang et al. .................. 313/504 |
| 2011/0056547 A1 | 3/2011 | Lee et al. |
| 2011/0209759 A1 | 9/2011 | Lee et al. |
| 2012/0025174 A1 | 2/2012 | Lee et al. |
| 2012/0061656 A1 | 3/2012 | Ohuchi et al. |
| 2012/0132934 A1 | 5/2012 | Ohuchi et al. |
| 2013/0119366 A1 | 5/2013 | Nishiyama et al. |
| 2013/0126840 A1 | 5/2013 | Fujimura et al. |
| 2013/0126841 A1 | 5/2013 | Nishiyama et al. |
| 2013/0126843 A1 | 5/2013 | Nishiyama et al. |
| 2013/0126846 A1 | 5/2013 | Harada et al. |
| 2013/0126847 A1 | 5/2013 | Harada et al. |
| 2013/0134403 A1 | 5/2013 | Harada et al. |
| 2013/0140543 A1 | 6/2013 | Harada et al. |
| 2013/0285042 A1 | 10/2013 | Komatsu et al. |
| 2013/0328039 A1 | 12/2013 | Ohuchi et al. |

FOREIGN PATENT DOCUMENTS

| | | |
|---|---|---|
| JP | 2006-245332 | 9/2006 |
| JP | 2008-243759 | 10/2008 |
| JP | 2008-283020 | 11/2008 |
| JP | 2009-536445 | 10/2009 |
| JP | 2011-044445 | 3/2011 |
| WO | 2007/079498 | 7/2007 |

OTHER PUBLICATIONS

Kwanghee Lee et al., "Air-Stable Polymer Electronic Devices", Advanced Materials, 19, pp. 2445-2449 (2007).

A.E. Taverner et al., "An inverse photoemission study of empty electronic states in TiO2", Surface Science 287/288, pp. 653-657 (1993).

A. K. See et al., "Inverse photoemission study of the defective TiO2(11 0) surface", Journal of Vacuum Science and Technology A 10(4), pp. 2591-2596 (Jul./Aug. 1992).

* cited by examiner

ORGANIC EL ELEMENT AND MANUFACTURING METHOD THEREOF, AND METAL OXIDE FILM FORMING METHOD

TECHNICAL FIELD

The present invention relates to an organic electroluminescent element (hereinafter referred to as an "organic EL element") that is an electric light-emitting element, a manufacturing method thereof, and a method of forming a metal oxide film, and in particular to a technology for driving, with low power consumption, a broad range of luminance levels from a low luminance level to a high luminance level, which is for a light source or the like.

BACKGROUND ART

In recent years, progress has been made in research and development of diverse functional elements which involve use of an organic semiconductor.

One typical example of such functional elements is an organic EL element. The organic EL element, which is a current-driven light-emitting element, includes a pair of electrodes, i.e. an anode and a cathode, and a functional layer layered between the pair of electrodes, the functional layer containing an organic material. To drive the organic EL element, a voltage is applied to between the pair of electrodes to use the phenomenon of electroluminescence that occurs when holes injected from the anode into the functional layer recombine with electrons injected from the cathode into the functional layer. Being self-luminescent, the organic EL element is highly visible. In addition, being a complete solid-state element, the organic EL element has excellent impact resistance. Owing to these advantages, more attention is being given to the applications of organic EL elements as a light-emitting element or a light source for various display apparatuses.

To cause the organic EL element to emit light with low power consumption and high luminance, efficient injection of carriers (i.e., holes and electrons) from the electrodes to the functional layer is important. In general, to inject carriers efficiently, providing injection layers between each of the two electrodes and the functional layer for lowering energy barriers therebetween is effective. An injection layer disposed between the functional layer and the anode is a hole injection layer made of an organic material such as copper phthalocianine or PEDOT (electroconductive polymer), or a metal oxide such as tungsten oxide.

Also, an injection layer disposed between the functional layer and the cathode is an electron injection layer made of an organic material such as a metal complex or oxadiazole, a low work-function metal such as barium, or ion crystal such as sodium fluoride.

On the other hand, to realize longevity of the organic EL element, each layer constituting the organic EL element needs to be stable to the air. This is because many of the organic materials, low work-function metals and the like constituting the functional layer and electrodes are susceptible to oxygen and water contained in the air and deteriorate.

A generally adopted measure for the problem is to seal the whole organic EL element to avoid it from being exposed to the air. At the same time, however, development of functional layers that are stable even in the air environment is underway. It is known in particular that the electron injection layer made of titanium oxide can inhibit oxygen and water from entering into an adjacent functional layer and have relatively high resistance against oxygen and water in the electron injection layer itself (Non-Patent Literature 1, Patent Literature 1).

CITATION LIST

Patent Literature

[Patent Literature 1] Japanese Patent Application Publication No. 2008-283020
[Patent Literature 2] Japanese Patent Application Publication No. 2011-044445

Non-Patent Literature

[Non-Patent Literature 1] Advanced Materials 19, 2445 (2007)
[Non-Patent Literature 2] Surface Science 287/288, 653 (1993)
[Non-Patent Literature 3] Journal of Vacuum Science and Technology A 10 (4), 2591 (1992)

SUMMARY OF INVENTION

Technical Problem

The following problems are present, however, in manufacturing an organic EL element including an electron injection layer made of titanium oxide based on the conventional technologies.

According to the technologies disclosed in Non-Patent Literature 1 and Patent Literature 1, the titanium oxide used has many oxygen defects, and the composition ratio is closer to that of titanium monoxide, which is black, than to the composition ratio of titanium dioxide that is transparent. The titanium oxide used in these technologies thus has low transmittance and may reduce the luminous efficiency of the element, and is not suitable for a top-emission organic EL element, in particular.

Also, electrons are assumed to be injected from a Fermi level of the cathode into a lower end of a conduction band of titanium oxide, conduct the lower end of the conduction band, and are injected into the LUMO (Lowest Unoccupied Molecular Orbital) of a functional layer. Here, when titanium oxide used therein has many oxygen defects, electrons moving at the lower end of the conduction band may be trapped in levels that have been caused due to the oxygen defects. In that case, conduction of the electrons and injection of the electrons into a functional layer are inhibited.

On the other hand, when titanium dioxide with almost no oxygen defect is used, a Fermi level of titanium oxide (that matches a Fermi level of an electrode with which it contacts) is distant away from the lower end of the conduction band, and thus an electron injection barrier between the cathode and the titanium oxide is high. This makes it difficult to inject electrons from the cathode.

It is therefore an object of the present invention to provide an organic EL element having longevity and low power consumption by including an electron injection layer that has stability to the air, high transmittance, excellent electron conduction, and excellent electric contact with the cathode, and to provide a manufacturing method thereof.

Solution to Problem

According to one aspect of the present invention, there is provided an organic EL element that includes an anode, a cathode, a functional layer, and an electron injection layer.

The anode and the cathode are disposed to face each other with a gap therebetween.

The functional layer contains an organic material and is inserted between the anode and the cathode.

The electron injection layer has a function to inject electrons into the functional layer and is inserted between the cathode and the functional layer.

In the organic EL element according to one aspect of the present invention, the electron injection layer contains a metal oxide with $d^0$ electron configuration, and a Fermi level of the electron injection layer is located in a vicinity of a lower end of a conduction band.

Advantageous Effects of Invention

The organic EL element according to one aspect of the present invention has a structure where the electron injection layer contains a metal oxide with $d^0$ electron configuration, and a Fermi level of the electron injection layer is located in a vicinity of a lower end of a conduction band.

With the above-described structure, the electron injection layer has stability to the air, high transmittance, excellent electron conduction, excellent electric contact with the cathode, and high efficiency in injecting electrons into the adjacent functional layer. This allows the organic EL element according to one aspect of the present invention to have longevity and low power consumption.

DESCRIPTION OF EMBODIMENTS

<<Aspect of Present Invention>>

Figure 1:
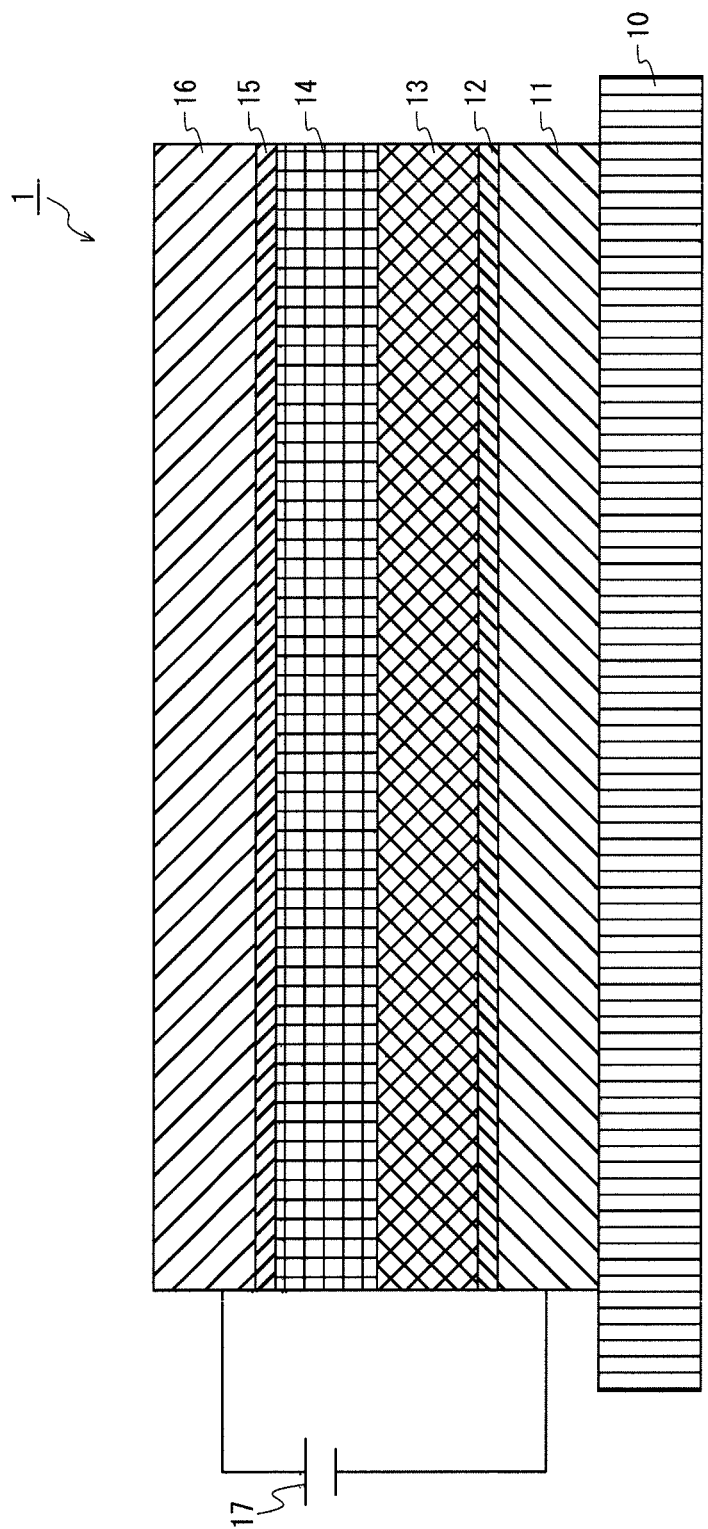
FIG. 1 is a schematic cross-sectional view illustrating the structure of an organic EL element 1 in Embodiment 1.

According to one aspect of the present invention, there is provided an organic EL element that includes: an anode and a cathode disposed to face each other with a gap therebetween; a functional layer that contains an organic material and is disposed between the anode and the cathode; and an electron injection layer that has a function to inject electrons into the functional layer and is disposed between the anode and the cathode.

The organic EL element according to one aspect of the present invention is characterized in that the electron injection layer contains a metal oxide with $d^0$ electron configuration, and a Fermi level of the electron injection layer is located in a vicinity of a lower end of a conduction band of the electron injection layer. With this structure, the electron injection layer of the organic EL element according to one aspect of the present invention has excellent electron conduction and excellent electric contact with the cathode, and is highly expected to have high efficiency in injecting electrons into the adjacent functional layer. This allows the organic EL element according to one aspect of the present invention to have longevity and low power consumption.

In a predetermined situation of the organic EL element according to one aspect of the present invention, a difference in binding energy between the Fermi level of the electron injection layer and the lower end of the conduction band of the electron injection layer may be at most 0.3 eV. With this structure, an electron injection barrier between the cathode and the electron injection layer becomes low. This promotes injection of electrons from the cathode into the electron injection layer.

In another predetermined situation of the organic EL element according to one aspect of the present invention, the metal oxide may be titanium oxide.

In a still another predetermined situation of the organic EL element according to one aspect of the present invention, a value of x in composition formula TiOx of the titanium oxide as the metal oxide may be at least 1.98 and less than 2. With this structure, the electron injection layer contains a very small number of oxygen defects, thus there is a low probability that electrons moving in the electron injection layer are trapped in levels that have been caused due to the oxygen defects. Thus the electron injection layer has an excellent electron conduction.

In a still another predetermined situation of the organic EL element according to one aspect of the present invention, a UPS spectrum, which represents relationship between binding energy and one of photoelectron intensity and standardized photoelectron intensity, may be downwardly convex in a section where the binding energy takes values from 0 eV to 3 eV. With this structure, the oxygen defects in the electron injection layer are reduced to be very small in number. Note that the expression "downwardly convex" indicates a state of gradually and smoothly changing in which an "upwardly concave (raised)" portion is not included.

According to another aspect of the present invention, there is provided a method of forming a film of a metal oxide, comprising: forming a cathode; and forming, on a surface of the cathode, a metal oxide film containing a transition metal oxide that can have $d^0$ electron configuration, by heating the metal oxide in an oxygen-containing environment.

In the method of forming a film of a metal oxide according to another aspect of the present invention, the forming the metal oxide film allows for the transition metal oxide contained in the metal oxide film to have $d^0$ electron configuration, and allows for a Fermi level of the metal oxide film to be located in a vicinity of a lower end of a conduction band of the metal oxide film. With this structure, it is possible to form a metal oxide film having an excellent electron conduction and excellent electron injection efficiency.

According to a still another aspect of the present invention, there is provided a method of manufacturing an organic EL element, comprising: forming a cathode; and forming, on a surface of the cathode, a metal oxide film containing a transition metal oxide that can have $d^0$ electron configuration, by heating the metal oxide in an oxygen-containing environment.

In the method of manufacturing an organic EL element according to the still another aspect of the present invention, the forming the metal oxide film allows for the transition metal oxide contained in the metal oxide film to have $d^0$ electron configuration, and allows for a Fermi level of the metal oxide film to be located in a vicinity of a lower end of a conduction band of the metal oxide film. With this structure, it is possible to form a metal oxide film having an excellent electron conduction and excellent electron injection efficiency. Thus the method of manufacturing an organic EL element according to the still another aspect of the present invention can manufacture an organic EL element that has longevity and low power consumption.

According to a further aspect of the present invention, there is provided a method of manufacturing an organic EL element, comprising: forming a cathode; forming, on a surface of the cathode, a metal oxide film containing a transition metal oxide that can have $d^0$ electron configuration, by heating a metal oxide in an oxygen-containing environment; forming an organic layer on the metal oxide film, the organic layer including a light-emitting layer; and forming an anode on the organic layer.

In the method of manufacturing an organic EL element according to the further aspect of the present invention, the forming the metal oxide film allows for the transition metal oxide contained in the metal oxide film to have $d^0$ electron configuration, and allows for a Fermi level of the metal oxide film to be located in a vicinity of a lower end of a conduction band of the metal oxide film. Thus the method of manufacturing an organic EL element according to the further aspect of the present invention can also manufacture an organic EL element that has longevity, is driven excellently at a low voltage, and is highly efficient.

The following describes the organic EL element in embodiments of the present invention, and results of performance confirmation experiments of the present invention and consideration thereof.

The figures herein are not necessarily drawn to scale.

Note also that the present invention is not limited to the following embodiments except for structural elements that are essential to the present invention.

Embodiment 1

Structure of Organic EL Element

FIG. 1 is a schematic cross-sectional view illustrating a part of the structure of an organic EL element 1 in Embodiment 1.

As illustrated in FIG. 1, the organic EL element 1 in the present embodiment has a structure where a laminate of an electron injection layer 12 and functional layers having predetermined functions (in this example, a light-emitting layer 13, a hole transport layer 14 and a hole injection layer 15) is inserted between a cathode 11 and an anode 16 that make an electrode pair.

More specifically, as illustrated in FIG. 1, the organic EL element 1 is formed by laminating the cathode 11, electron injection layer 12, light-emitting layer 13, hole transport layer 14, hole injection layer 15, and anode 16 on a main surface of a substrate 10 in the stated order. The anode 16 and the cathode 11 are connected with a power supply 17 such that power is supplied to the organic EL element 1 from an external source.

(Cathode)

The cathode 11 is made of, for example, ITO (Indium Tin Oxide) and is a thin film with a thickness of 50 nm.

(Electron Injection Layer)

The electron injection layer 12 is made of titanium oxide and has, for example, a thickness of 1 nm.

The electron injection layer 12 is desirably composed of only titan and oxygen as elements, but may contain a minute amount of impurities that might mix therein in a normal level.

It should be noted here that the electron injection layer 12 is formed by a predetermined manufacturing method (for example, the manufacturing method described below) so that the number of oxygen defects in titanium oxide is as small as possible and the Fermi level is located in the vicinity of the lower end of the conduction band.

(Light-Emitting Layer)

The light-emitting layer 13 is made of, for example, Alq3(Tris(8-quinolinyloxy)aluminum), with a thickness of 50 nm.

(Hole Transport Layer)

The hole transport layer 14 is made of, for example, α-NPD(Bis[N-(1-naphthyl)-N-phenyl]benzidine), with a thickness of 50 nm.

(Hole Injection Layer)

The hole injection layer 15 is made of, for example, tungsten oxide, with a thickness of 10 nm.

The hole injection layer 15, as disclosed in Patent Literature 2, has a predetermined electron state. This allows for an excellent hole injection efficiency.

(Anode)

The anode 16 is made of, for example, aluminum, with a thickness of 100 nm.

(Substrate)

The substrate 10 is made of an insulating material such as alkali-free glass, soda glass, non-fluorescent glass, phosphate glass, borate glass, quartz, acrylic resin, styrenic resin, polycarbonate resin, epoxy resin, polyethylene, polyester, silicone resin, alumina, etc.

(Acts and Effects of Organic EL Element 1)

In the organic EL element 1 having the above-described structure, the electron injection layer 12 made of titanium oxide contains a very small number of oxygen defects, and thus is not colored, has high transmittance, and has a very low possibility that electrons may be trapped in levels that have been caused due to the oxygen defects. In addition, since the electron injection layer 12 contains a very small number of oxygen defects, it has almost complete $d^0$ electron configuration, and thus electrons injected into a conduction band composed of Ti 3d orbitals receive a strong repulsion force from a valence band of a closed shell and are easily injected into the adjacent light-emitting layer 13.

Also, although very small in number, oxygen defects exist in the electron injection layer 12 to some extent, thus a Fermi level is located in the vicinity of the lower end of the conduction band, and an electron injection barrier between the electron injection layer 12 and the cathode 11 is low. Therefore the organic EL element 1 of the present embodiment realizes a high electron injection efficiency, a high electron transport efficiency, and a high luminous efficiency, as well.

The following describes one example of a manufacturing method of the organic EL element 1 as a whole.

(Manufacturing Method of Organic EL Element)

Figure 2:
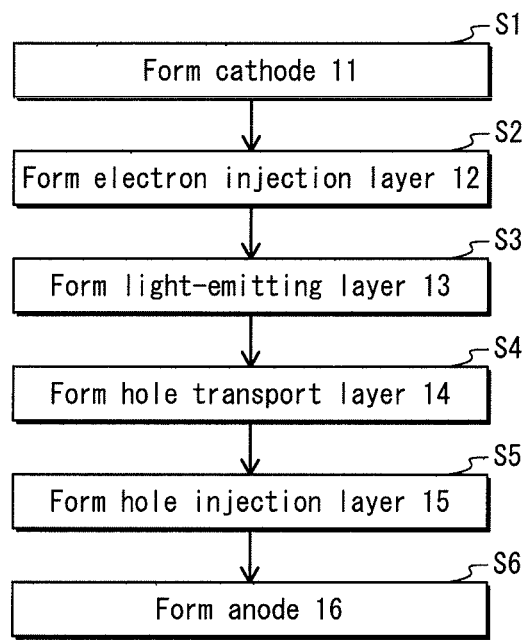
FIG. 2A is a flowchart illustrating a manufacturing method of the organic EL element 1.
FIG. 2B is a table illustrating a part of conditions for forming the electron injection layer.

FIG. 2A is a flowchart schematically illustrating a manufacturing method of the organic EL element 1.

First, the substrate 10 is placed in a chamber of a sputtering film forming apparatus. A predetermined sputter gas is then introduced into the chamber, and a film of the cathode 11, which is made of ITO and has a thickness of 50 nm, is formed by the reactive sputtering method (step S1 of FIG. 2A).

Subsequently, the substrate 10 is placed in a chamber of a vacuum deposition apparatus, and a film of the electron injection layer 12, which is made of titanium oxide and has a thickness of 1 nm, is formed on the cathode 11 by an electron beam evaporation method targeting titanium dioxide (step S2 of FIG. 2A). In this process, the temperature of the substrate 10 is kept at 500° C. as illustrated in FIG. 2B. This allows the electron injection layer 12 made of titanium oxide to be formed, wherein the electron injection layer 12 contains a very small number of oxygen defects and has almost complete d0 electron configuration, and the Fermi level is located in the vicinity of the lower end of the conduction band.

Next, the substrate 10 is cooled to the room temperature, and the light-emitting layer 13, which is made of Alq3 and has a thickness of 50 nm, the hole transport layer 14, which is made of α-NPD and has a thickness of 50 nm, the hole injection layer 15, which is made of tungsten oxide and has a thickness of 10 nm, and the anode 16, which is made of aluminum and has a thickness of 100 nm, are laminated in the stated order by, for example, the resistance heating evaporation method (steps S3 through S6 of FIG. 2A).

Note that although not illustrated in FIG. 1, for the purpose of restricting the organic EL element 1 from being exposed to the air, a sealing layer may be formed on the surface of the anode 16, or a sealing "can" may be placed for the whole organic EL element 1 to be isolated from the surrounding space. The sealing layer may be made of, for example, a material such as SiN (silicon nitride) or SiON (silicon oxynitride) and may be formed such that it seals the whole organic EL element 1 inside. The sealing can may be made of the same material as the substrate 10, and a getter that adsorbs water or the like is placed in a closed space.

The organic EL element 1 is completed through the above-described steps.

(Various Experiments and Consideration)
[Electron State of Titanium Oxide]

With regard to the electron injection layer 12 made of titanium oxide in Embodiment 1, it has a very small number of oxygen defects, and a value of x in composition formula TiOx is approximately 2, and the Fermi level is located in the vicinity of the lower end of the conduction band. These facts were confirmed by the following experiments.

Two samples of titanium oxide films having a thickness of 10 nm were formed on the ITO substrate by the electron beam evaporation method. One of the two samples was manufactured by keeping the temperature of the substrate at 500° C. during the film forming process in accordance with the above-described manufacturing method, and the other was manufactured by keeping the substrate at the room temperature.

Hereinafter, a titanium oxide film formed at the room temperature is referred to as an "as-depo film", and a titanium oxide film formed at 500° C. (corresponding to the electron injection layer made of titanium oxide of the present invention) is referred to as an "annealed film". Note that it has been confirmed through another experiment that the ITO substrate does not change in quality when exposed to the heat of 500° C.

1. UPS Measurement

An Ultraviolet Photoelectron Spectroscopy (UPS) measurement was performed on the two samples of titanium oxide films. Note that in general, a UPS spectrum reflects the state of occupied levels such as a valence band that are present in an area ranging from the surface to a depth of several nm of the object of the measurement.

(Conditions for UPS Measurement)

Figure 3:
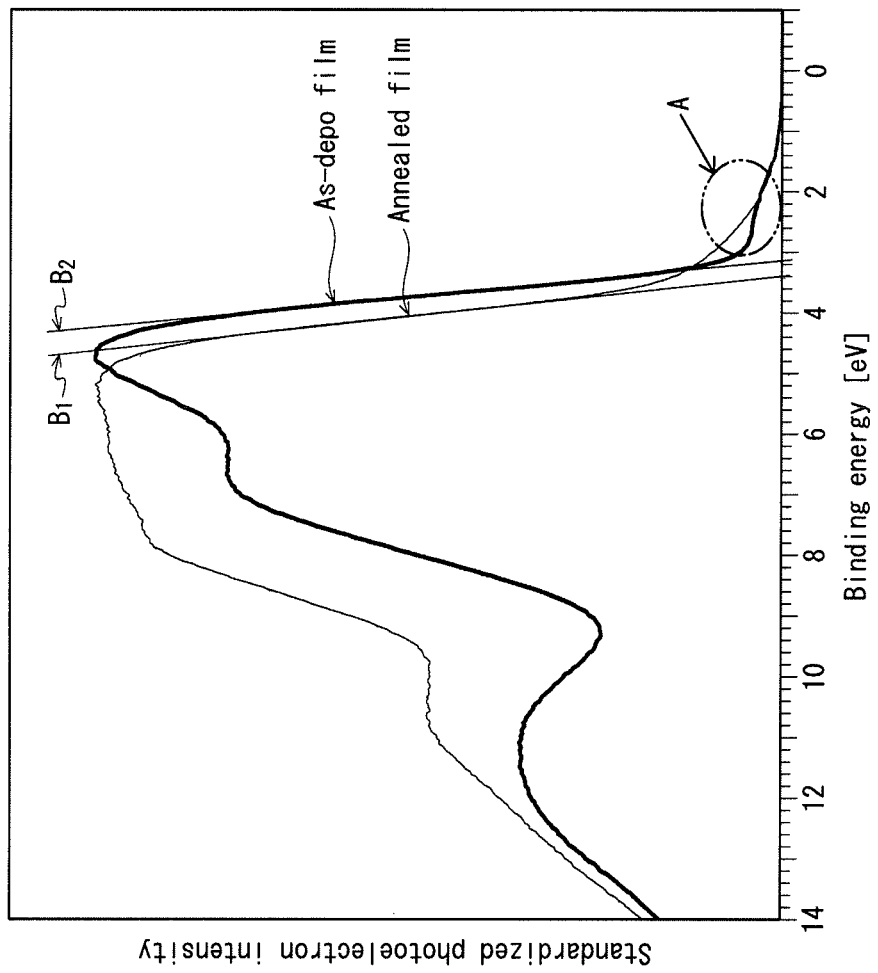
FIG. 3 is a diagram illustrating a UPS spectrum of titanium oxide.
Figure 4:
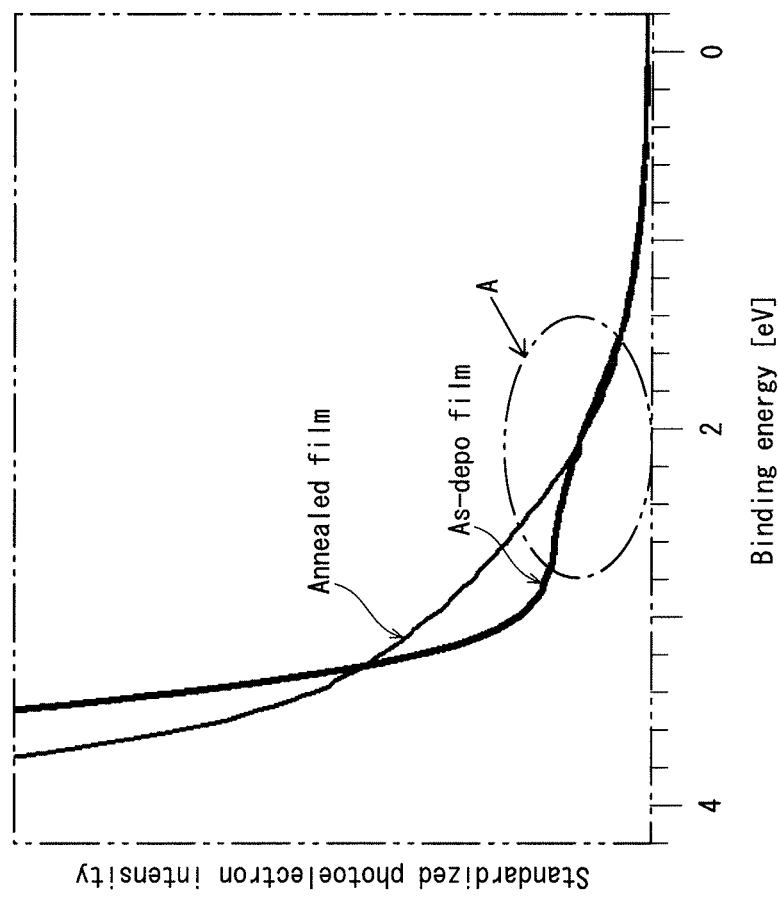
FIG. 4 is an enlargement of portion A of FIG. 3.

Used equipment: X-ray/ultraviolet photoelectron spectroscopy apparatus PHI5000 VersaProbe (made by ULVAC PHI, Inc.)
Light source: He I radiation
Bias: none
Photoelectron emission angle: substrate normal line direction
Measurement point interval: 0.05 eV FIG. 3 illustrates UPS spectra of the titanium oxide films. In FIG. 3, the origin of the binding energy represented by the horizontal axis is the Fermi level of the ITO substrate (that matches the Fermi levels of the titanium oxide films), and the leftward direction is the positive direction (in which the binding becomes stronger). Also, the vertical axis represents the photoelectron intensity standardized by the maximum value of each spectrum. FIG. 4 is an enlargement of a portion indicated by arrow A in FIG. 3.

As illustrated in the arrow A portion of FIGS. 3 and 4, the UPS spectrum of the as-depo film has a rise in a section where the binding energy ranges from 0 eV to 3 eV. The rise observed in the UPS spectrum of the as-depo film represents levels caused by the presence of oxygen defects in the titanium oxide (see Non-Patent Literature 3). This indicates that oxygen defects are present in the as-depo film significantly.

On the other hand, as illustrated in the arrow A portion of FIGS. 3 and 4, the UPS spectrum of the annealed film does not have such a rise in the section where the binding energy ranges from 0 eV to 3 eV, but is downwardly convex in the section. From this, it is assumed that the annealed film has a very small number of oxygen defects, if any.

Actually, the composition ratio (the value of x in composition formula TiOx) of each of the titanium oxide films, which is estimated from the results of the X-ray photoelectron spectroscopy measurement using the same photoelectron spectroscopy apparatus, is: 1.9 in the case of the as-depo film; and approximately 2.0 in the case of the annealed film (at least 1.98 allowing for a margin of error during the measurement). This indicates that the annealed film has a very small number of oxygen defects.

Next, a comparison is made with regard to the position of the upper end of the valence band.

In the case of titanium oxide, the largest rise in the UPS spectrum is the upper end of the valence band composed of the O2p orbital, and it is possible to regard the intersections of the horizontal axis and the tangent lines (lines $B_1$ and $B_2$ in FIG. 3) passing through inflection points of the rises of the UPS spectra, as the binding energy positions at the upper end of the valence band.

When the tangent line $B_1$ is compared with the tangent line $B_2$, it is found that the Fermi level of the film (the origin of the horizontal axis) is closer to the upper end of the valence band of the as-depo film than to the upper end of the valence band of the annealed film. It is understood from this that if the two titanium oxide films (the as-depo film and the annealed film) have band gaps that are almost the same in size, the annealed film has a shorter distance between the Fermi level of the film and the lower end of the conduction band. Note that the two titanium oxide films are almost the same in the size of the band gap estimated from the light absorption.

2. IPES Measurement

For further confirmation of the position of the Fermi level, the Inverse PhotoEmission Spectroscopy (IPES) measurement was performed on the two titanium oxide films. Note that in general, an IPES spectrum reflects the state of non-occupied levels such as a conduction band that are present in an area ranging from the surface to a depth of several nm of the object of the measurement.

Figure 5:
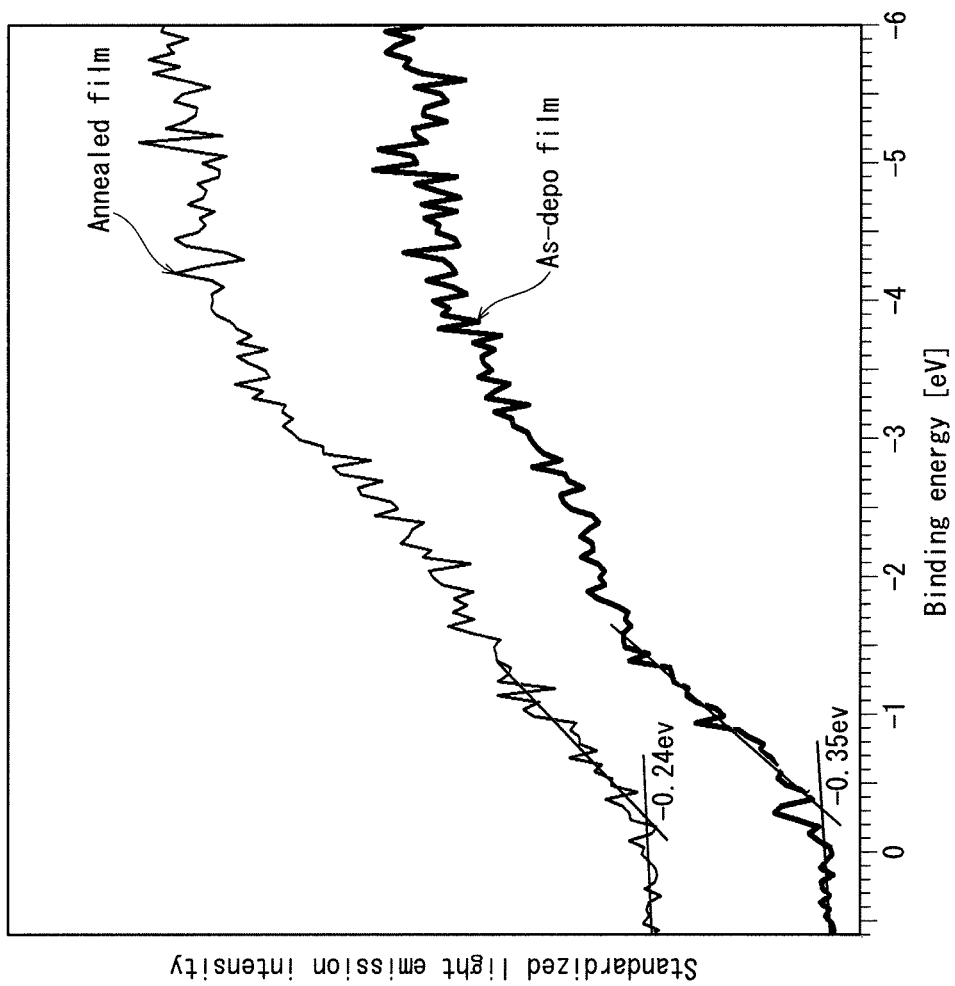
FIG. 5 is a diagram illustrating an IPES spectrum of titanium oxide.

FIG. 5 illustrates the IPES spectra of the titanium oxide films (the as-depo film and the annealed film) In FIG. 5, the origin of the binding energy represented by the horizontal axis is the Fermi level of the ITO substrate (that matches the Fermi levels of the titanium oxide films), and the leftward direction is the positive direction (in which the binding becomes stronger). Also, in FIG. 5, the vertical axis represents the light emission intensity per unit number of incident electrons, standardized by the maximum value of each spectrum.

In the case of titanium oxide, the first rise in the IPES spectrum is the lower end of the conduction band composed of the Ti3d orbital. Approximate straight lines are drawn in the rise portion and the background, and a position on the horizontal axis corresponding to the intersection of the straight lines can be regarded as the binding energy position of the lower end of the conduction band. In FIG. 5, the positions of the lower ends of the conduction bands of the two titanium oxide films are indicated by numerical values. As illustrated in FIG. 5, even if the errors in drawing the approximate straight lines and in reading the intersections are taken into account, it is apparent that the Fermi level of the film (the origin of the horizontal axis) is closer to the lower end of the conduction band, in the annealed film than in the as-depo film.

It is confirmed from the above that the electron injection layer 12 made of titanium oxide in Embodiment 1 contains a very small number of oxygen defects (thus it has almost complete $d^0$ electron configuration), and the Fermi level is located in the vicinity of the lower end of the conduction band. From FIG. 5, the difference in binding energy between the Fermi level of the annealed film and the lower end of the conduction band is 0.24 eV, and it is desirable that in the electron injection layer made of titanium oxide of the present invention (the electron injection layer 12 in Embodiment 1), this difference is at most 0.3 eV.

Note that a metal oxide having $d^0$ electron configuration is a metal oxide that has no electron in the d orbital of the metal atoms. In the case of titanium dioxide having the stoichiometry composition, all of the four valence electrons are taken out from the Ti atom two each by the O atoms and the d orbital, in which the valence electrons have been contained, becomes completely empty. It is thus possible to regard that the titanium oxide of the present invention, which contains a very small number of oxygen defects and for which the value of x in composition formula TiOx is approximately 2, has almost complete d0 electron configuration.

Furthermore, since the value of x in composition formula TiOx is approximately 2, the electron injection layer composed of titanium oxide of the present invention is hardly colored.

[Relationship Between Electron State of Titanium Oxide and Element Characteristics]

An organic EL element using the electron injection layer made of titanium oxide of the present invention (the electron injection layer 12 in Embodiment 1) is driven excellently at a low voltage. For confirmation of the above, two types of organic EL elements, whose electron injection layers are respectively made of the as-depo film and the annealed film, were manufactured. Hereinafter, an organic EL element whose electron injection layer is the as-depo film is referred to as an "as-depo-BPD", and the organic EL element 1 of Embodiment 1 whose electron injection layer is the annealed film is referred to as an "annealed-BPD".

The actual products of these organic EL elements have the same structure as the organic EL element 1 illustrated in FIG. 1 and were manufactured by the manufacturing method described above, except that the as-depo-BPD was manufactured by keeping the temperature of the substrate at the room temperature during the titanium oxide film forming process.

Figure 6:
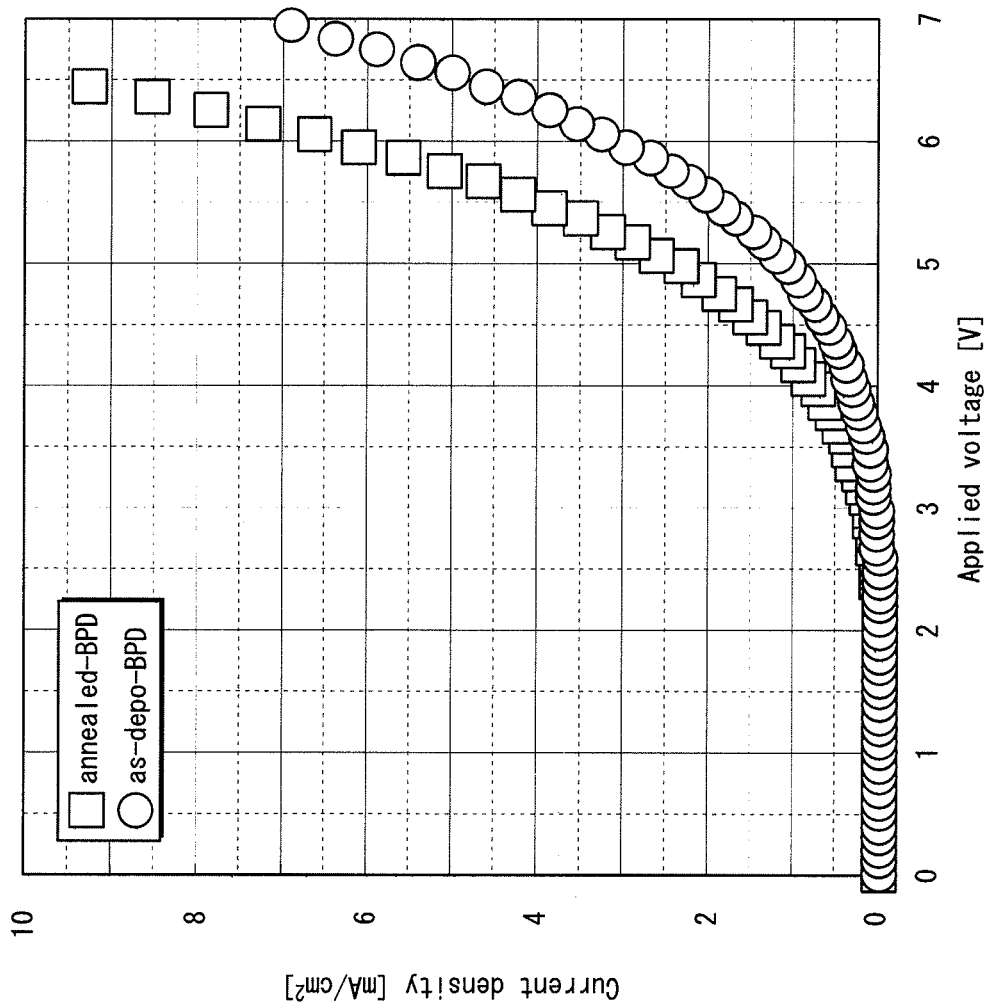
FIG. 6 is an element characteristics chart illustrating curves representing relationships between the current density and applied voltage in the generated organic EL element.

The manufactured organic EL elements were connected to direct current power sources, and voltages were applied. The applied voltages were varied, and the values of current flowing at corresponding values of voltage were converted to current densities, namely, values of elements per unit area. FIG. 6 illustrates current density versus applied voltage curves of the organic EL elements (the as-depo-BPD and the annealed-BPD). In FIG. 6, the vertical axis represents the current density ($mA/cm^2$) and the horizontal axis represents the applied voltage (V).

As indicated by FIG. 6, the current density versus applied voltage curve of the annealed-BPD rises faster than that of the as-depo-BPD. This suggests that the annealed-BPD obtains a higher current density at a lower applied voltage than the as-depo-BPD.

As described above, the organic EL element whose electron injection layer is made of titanium oxide of the present invention (the organic EL element 1 of Embodiment 1) is driven at a lower voltage than a conventional organic EL element whose electron injection layer is made of titanium oxide that contains oxygen defects significantly.

Note that the reasons for the electron injection layer 12, which is made of a titanium oxide film formed at a high temperature, to contain a very small number of oxygen defects are as follows. When titanium dioxide, the target of the electron beam evaporation method, is heated by an electron beam in accordance with the electron beam evaporation method, the target is decomposed and the vapor deposition apparatus is filled with oxygen that is generated by the decomposition (in a product manufactured by the above-described manufacturing method, the partial pressure of the generated oxygen was at a level of $10^{-4}$ Pa). When the vapor deposition is performed at a high temperature in such an oxygen-rich environment, the oxidation of titan atoms, which come flying from the target decomposed by the electron beam, and clusters composed of titanium and oxygen is promoted, and they are oxidized close to the stoichiometry composition. In this way, the titanium oxide film containing a very small number of oxygen defects is formed.

[Mechanism of Electron Injection and Conduction in Titanium Oxide]

As the reasons for the organic EL element with the electron injection layer of the present invention to have excellent characteristics, the following reasons (i) to (iii) are adduced.

(i) The Fermi level of the electron injection layer (that matches the Fermi level of the cathode) is located in the vicinity of the lower end of the conduction band, thus an electron injection barrier between the cathode and the electron injection layer is low, providing high efficiency in injecting electrons from the cathode into the electron injection layer.

(ii) The electron injection layer contains a very small number of oxygen defects, thus there is a low probability that electrons moving in the electron injection layer are trapped in levels that have been caused due to the oxygen defects. Thus the electron conduction in the electron injection layer is difficult to be inhibited.

(iii) Since the electron injection layer has almost complete $d^0$ electron configuration, electrons injected from the cathode into a conduction band of d orbital receive a strong repulsion force from a valence band of a closed shell and are pushed out from the electron injection layer into the LUMO of the adjacent functional layer. Thus electrons are injected from the electron injection layer into the functional layer with high efficiency.

In particular, the reason (iii) is related to the fact that the titanium oxide having $d^0$ electron configuration is used as the photocatalyst. That is to say, when electrons are excited by the ultraviolet light from the valence band of the titanium oxide to the conduction band, holes generated in the valence band have a strong oxidizing power (power to take electrons), and electrons excited in the conduction band have a strong reducing power (power to donate electrons). When, for example, water is adsorbed, the water is oxidized to oxygen and hydrogen ion, and at the same time, is reduced to hydrogen and hydroxide ion. The explanation "(electrons) are pushed out from the electron injection layer into the LUMO of the adjacent functional layer" in the above-described reason (iii) is considered to mean that electrons injected into the conduction band of titanium oxide "reduce" the molecules of the functional layer and donate electrons to the functional layer.

Note that an electron injection layer made of a titanium oxide, such as the as-depo film, which contains a relatively large number of oxygen defects, is considered not to satisfy the above (i), and an electron injection layer made of a titanium oxide whose composition ratio is close to that of titanium monoxide may have high conductivity, but is considered not to satisfy the above (ii) or (iii).

On the other hand, if the oxygen defects are simply eliminated, it is merely a change from a so-called n-type semiconductor to an intrinsic semiconductor, and in that case, as described above, the Fermi level is located away from the lower end of the conduction band and the above (i) is not satisfied, as disclosed in Non-Patent Literature 2. Conversely, in the case of the as-depo film that contains a relatively large number of oxygen defects, levels that have been caused due to the oxygen defects spread largely and attract the Fermi level, and the Fermi level is located away from the lower end of the conduction band, as well. From the above discussion, it is concluded that the titanium oxide of the present invention contains a very small but appropriate number of oxygen defects, and thus occupied levels caused due to the small number of localized oxygen defects are located in the vicinity of the lower end of the conduction band and fix the Fermi level there.

According to the present invention, the amount of the appropriate number of oxygen defects is defined by using the shape of the UPS spectrum and/or the position of the Fermi level, thereby making it possible to obtain an excellent electron injection layer.

Embodiment 2

Structure of Organic EL Element

Figure 7:
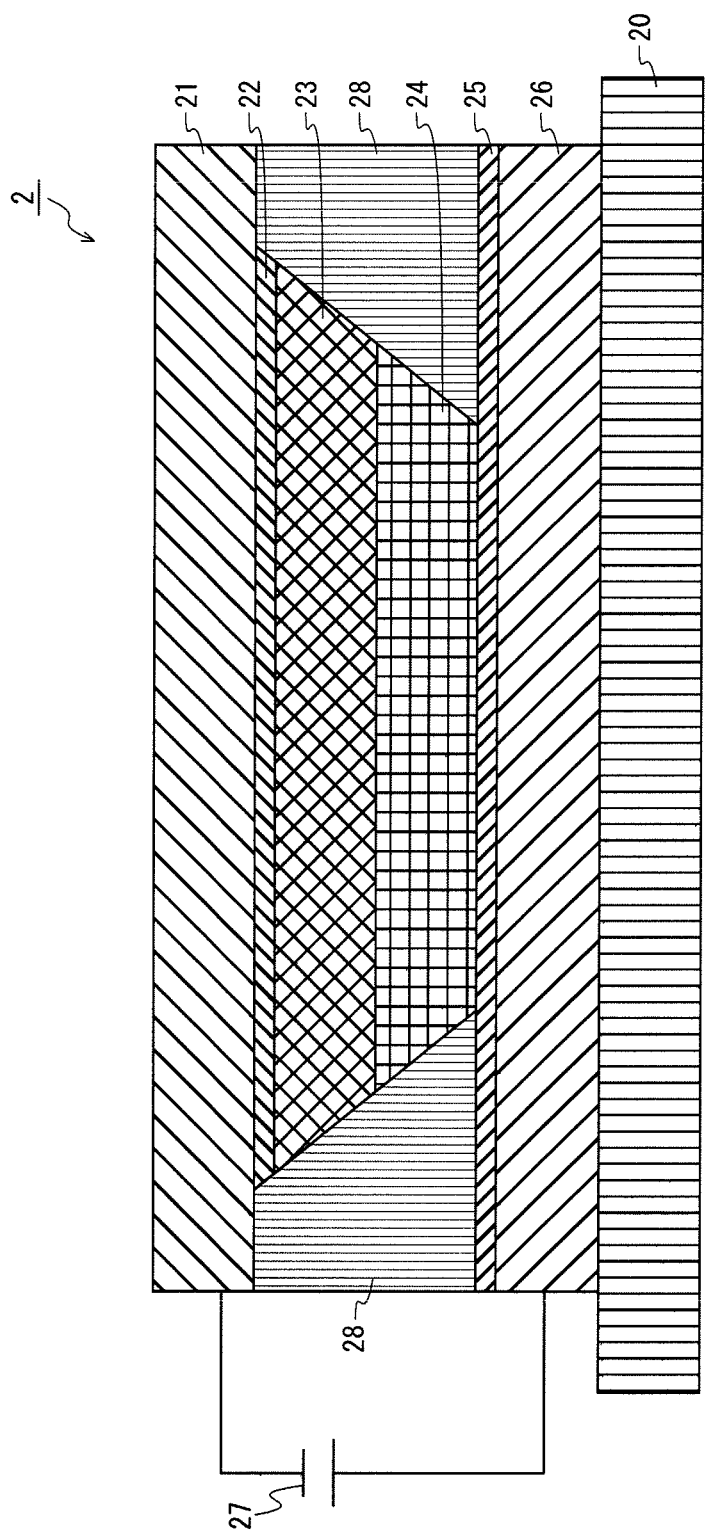
FIG. 7 is a schematic cross-sectional view illustrating the structure of an organic EL element 2 in Embodiment 2.

FIG. 7 is a schematic cross-sectional view illustrating a part of the structure of an organic EL element 2 in Embodiment 2.

The organic EL element 2 is a solution-processed organic EL element that is manufactured by coating the electron injection layer, light-emitting layer and buffer layer by the wet process, and has a structure where a laminate of an electron injection layer 22 and functional layers having predetermined functions (in this example, a hole injection layer 25, a buffer layer 24, and a light-emitting layer 23) is inserted between a cathode 21 and an anode 26 that make an electrode pair.

More specifically, as illustrated in FIG. 7, the organic EL element 2 is formed by laminating the anode 26, hole injection layer 25, buffer layer 24, light-emitting layer 23, electron injection layer 22, and cathode 21 on a main surface of a substrate 20 in the stated order.

(Anode)

The cathode 26 is made of, for example, ITO, with a thickness of 50 nm.

(Hole Injection Layer)

The hole injection layer 25 is made of, for example, tungsten oxide, with a thickness of 30 nm.

The hole injection layer 25 is a film that is formed under the predetermined conditions disclosed in Non-Patent Literature 2. This allows for an excellent hole injection efficiency.

(Bank)

On the surface of the hole injection layer 25, a bank 28 made of an insulating organic material (e.g., acrylic resin, polyimide resin, novolac-type phenolic resin, etc.) is formed in stripes or in a grid shape structure to have a predetermined trapezoidal shape in a cross section. On the surface of each region of the hole injection layer 25 separated by the surrounding walls of the bank 28, the buffer layer 24, light emitting layer 23 having a luminescent color of red (R), green (G), or blue (B), and electron injection layer 22 are formed.

As illustrated in FIG. 7, in the case where the organic EL element 2 is used in an organic EL panel, a series of three organic EL elements 2 respectively corresponding to the luminescent colors of R, G and B are provided on the substrate 20 as one unit (pixel), and a plurality of the units are provided on the substrate 20 as a whole.

Note that the bank 28 is not an indispensable structural element for the present invention, but may be omitted when, for example, the organic EL element 2 is used separately.

(Buffer Layer)

The buffer layer 24 is made of, for example, TFB(Poly (9,9-di-n-octylfluorene-alt-(1,4-phenylene-((4-sec-butylphenyl)imino)-1,4-phenylene), which is an amine-based organic polymer, and has a thickness of 20 nm.

(Light-Emitting Layer)

The light-emitting layer is made of, for example, F8BT (Poly(9,9-di-n-octylfluorene-alt-benzothiadiazole)), which is an organic polymer, and has a thickness of 70 nm.

However, the light-emitting layer 23 is not limited to the above material, but may include a known structural material. Examples of the material in the light-emitting layer 23 include a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as described in Japanese Patent Application Publication No. H5-163488.

(Electron Injection Layer)

The electron injection layer 22 is formed by laminating microcrystals of titanium oxide whose particle size is in an approximate range from 5 nm to 30 nm.

The microcrystals are desirably composed of only titan and oxygen as elements, but may contain a minute amount of impurities that might mix therein in a normal level.

The microcrystals may have a predetermined electron state. This allows for the titanium oxide to contain as small a number of oxygen defects as possible, and allows for the Fermi level to be located in the vicinity of the lower end of the conduction band.

(Cathode)

The cathode 21 is made of, for example, aluminum, and has a thickness of 100 nm.

A power supply 27 is connected with the anode 26 and the cathode 21 such that power is supplied to the organic EL element 2 from an external source.

(Manufacturing Method of Organic EL Element)

First, the substrate 20 is placed in the chamber of a sputtering apparatus for film formation. Subsequently, a film of the anode 26, which is made of ITO and has a thickness of 50 nm, is formed by reactive sputtering by introducing a predetermined sputter gas into the chamber.

Next, a film of the hole injection layer 25, which is made of tungsten oxide, is formed on the anode 26 by reactive sputtering. It is desirable that the hole injection layer 25 is formed under the predetermined conditions disclosed in Non-Patent Literature 2 for forming tungsten oxide having a predetermined electron state.

Next, a bank material is prepared which is, for example, a photosensitive resist material, desirably a photoresist material containing a fluorine-based material. The bank material is uniformly coated on the surface of the hole injection layer 25. The coated bank material is then pre-baked. A mask with openings of a predetermined shape (the pattern of the bank to be formed) is then laid thereon. Subsequently, the hole injection layer 25 with the mask thereon is exposed to light, then unhardened portions of the bank material are washed away by developer. The resultant is cleaned with pure water and the bank 28 is completed.

Next, ink of a composition containing an organic material is dropped on portions of the surface of the hole injection layer 25 that are surrounded by the bank 28 and exposed to the air in the wet process executed by, for example, the ink jet method or gravure printing method, and the solvent is volatilized to be removed. This completes the formation of the buffer 24.

Next, ink of a composition containing an organic light-emitting material is dropped on the surface of the buffer layer 24 by the same method, and the solvent is volatilized to be removed. This completes the formation of the light-emitting layer 23.

Next, dispersion ink is dropped on the surface of the light-emitting layer 23, and the solvent is volatilized to be removed, the solvent of the dispersion ink containing dispersed microcrystals of titanium oxide whose particle size is in an approximate range from 5 nm to 30 nm. This completes the formation of the electron injection layer 22 that contains microcrystals of titanium oxide.

It should be noted here that the microcrystals of titanium oxide are formed to contain a very small but appropriate number of oxygen defects within or on the surface thereof such that the electron injection layer 22 have the same UPS spectrum and the same position of the Fermi level as the electron injection layer 12 of Embodiment 1.

The method for forming the buffer layer 24, light-emitting layer 23, and electron injection layer 22 is not limited to the above-described one (the ink jet method or the gravure printing method), but any known method such as the dispenser method, nozzle coat method, spin coat method, intaglio printing, or letterpress printing may be used for dropping or coating ink.

After this, the cathode 21 made of aluminum is formed by the vapor deposition method.

Note that although not illustrated in FIG. 7, for the purpose of restricting the organic EL element 2 from being exposed to the air, a sealing layer may be formed on the surface of the anode 21, or a sealing "can" may be placed for the whole organic EL element 2 to be isolated from the surrounding space.

The organic EL element 2 is completed through the above-described steps.

<<Other Considerations>>

In Embodiments 1 and 2, titanium oxide is used as the material of the electron injection layer.

However, the electron injection layer of the present invention is not limited to titanium oxide, but any transition metal oxide that can have $d^0$ electron configuration as the titanium oxide can may be used as the material of the electron injection layer, and when it has a very small number of oxygen defects, it produces similar effects to those of Embodiments 1 and 2. For example, zirconium dioxide ($ZrO_2$), hafnium dioxide ($HfO_2$), divanadium pentoxide ($V_2O_5$), diniobium pentoxide ($Nb_2O_5$), tantalum pentoxide ($Ta_2O_5$), tungsten trioxide ($WO_3$), or molybdenum trioxide ($MoO_3$) may be used.

Note that the above-mentioned transition metal oxide having $d^0$ electron configuration may be an at least ternary composite oxide. For example, $LaTiO_2N$ or $Sm_2Ti_2S_2O_5$ may be used.

Furthermore, the electron injection layer is not limited to a layer made of titanium oxide, but the electron injection layer may be any type of layer as far as it contains a metal oxide having $d^0$ electron configuration.

In Embodiment 1, a titanium oxide film is formed by heating titanium oxide at 500° C. in an oxygen-rich environment by the electron beam evaporation method.

However, the method for forming the electron injection layer of the present invention is not limited to the electron beam evaporation method, but the electron injection layer may be formed by any other film formation method, such as the sputtering method, as far as it forms the film by heating a material in an environment in which relatively rich oxygen is contained. In that case, it is desirable that, during the film formation process, the substrate is kept in a temperature range in which a transition metal oxide, which can have d0 electron configuration, can be crystallized. For example, at 500° C., the temperature used in Embodiment 1, titanium oxide of amorphous structure is easily crystallized into anatase structure. Also, when the substrate is kept at approximately 800° C., titanium oxide is easily crystallized into rutile structure. Setting such a temperature range promotes oxidization and formation of a metal oxide film having a very small number of oxygen defects. More specifically, it is appropriate to keep the substrate 10 in a temperature range, for example, from 300° C. to 900° C.

during the process of forming the electron injection layer made of titanium oxide of Embodiment 1.

Also, it is appropriate to keep the substrate 10 in a temperature range from 700° C. to 900° C. during the process of forming the electron injection layer made of, for example, tantalum pentoxide.

Also, an appropriate adjustment of the oxygen partial pressure in the film formation environment and the substrate temperature allows for the Fermi level to be located in the vicinity of the lower end of the conduction band, with a very small number of oxygen defects.

The functional layer of the present invention may be composed of any of a hole injection layer for facilitating injection of holes, a hole transport layer for transporting holes, a light-emitting layer for emitting light by recombination of holes and electrons injected therein, an electron transport layer for transporting electrons, and a buffer layer used for adjustment of optical characteristics or for blocking electrons, or may be composed of a combination of two or more layers among these layers, or may be composed of all of these layers.

The present invention is focused on the electron injection layer. However, there are other layers in the organic EL element, and the layers perform the above-described functions respectively. Here, the functional layer is meant to be a layer, other than the electron injection layer, that is necessary for the organic EL element.

In the organic EL element of the present invention, an electron transport layer may be formed between an electron injection layer and a light-emitting layer. The electron transport layer has a function to transport electrons, which are injected from the electron injection layer, to the light-emitting layer. The electron transport layer may be made of an organic material having an electron transportability. The organic material having an electron transportability is an organic material having a characteristic to transfer electrons by the charge transfer reaction between molecules. This may be called an n-type organic semiconductor.

The organic EL element of the present invention is not limited to the structure where the element is used separately. It is possible to construct an organic EL light-emitting apparatus by collecting a plurality of organic EL elements on a substrate as pixels. Such an organic EL light-emitting apparatus can be implemented by setting the film thickness of each layer of each element appropriately, and can be used as, for example, a lighting apparatus. It is further possible to construct an organic EL panel for use in an image display apparatus.

In the case where an organic EL panel is manufactured by using the organic EL element of the present invention, the shape of the bank is not limited to a so-called pixel bank (grid-shaped bank), but may be a line bank.

In Embodiment 2, an organic material is used as the bank material. However, not limited to this, an inorganic material may be used. In that case, the bank material layer may be formed by coating or the like in a similar manner to the bank material layer made of an organic material. The bank material layer may be removed as follows. That is to say, first a resist pattern may be formed on the bank material layer, then etching may be performed by using a certain type of etchant (e.g., tetramethylammonium hydroxide (TMAH) solution).

INDUSTRIAL APPLICABILITY

The organic EL element of the present invention is usable as a display element in displays for mobile phones or televisions or in various types of light sources. In any usage, it is applicable as an organic EL element that can be driven with low power consumption to emit light of a broad range of luminance levels from a low luminance level to a high luminance level, which is for use as a light source or the like. With such high performance, the organic EL element of the present invention is usable for a variety of purposes, for example, in various types of display apparatuses at home, public facilities, and working places, television apparatuses, displays for mobile electronic equipment, and light sources.

REFERENCE SIGNS LIST

1, 2 organic EL element
10, 20 substrate
11, 21 cathode
12, 22 electron injection layer
13, 23 light-emitting layer
14 hole transport layer
15, 25 hole injection layer
16, 26 anode
17, 27 power source
24 buffer layer

The invention claimed is:

1. An organic EL element, comprising:
an anode and a cathode disposed to face each other with a gap therebetween;
a functional layer that contains an organic material and is disposed between the anode and the cathode; and
an electron injection layer that has a function to inject electrons into the functional layer and is disposed between the anode and the cathode,
wherein the electron injection layer contains a metal oxide with $d^0$ electron configuration,
wherein the electron injection layer has a crystalline structure,
wherein a Fermi level of the electron injection layer is located in a vicinity of a lower end of a conduction band of the electron injection layer, such that a difference in binding energy between the Fermi level of the electron injection layer and the lower end of the conduction band of the electron injection layer is at most 0.3 eV, and
wherein an Ultraviolet Photoelectron Spectroscopy (UPS) spectrum, which represents a relationship between binding energy and one of photoelectron intensity and standardized photoelectron intensity, is downwardly convex in a section where the binding energy takes values from 0 eV to 3 eV.

2. The organic EL element of claim 1,
wherein the metal oxide is titanium oxide.

3. The organic EL element of claim 2,
wherein a value of x in composition formula TiOx of the titanium oxide as the metal oxide is at least 1.98 and less than 2.

* * * * *